(12) United States Patent  
Grenouillet et al.

(10) Patent No.: US 8,729,577 B2  
(45) Date of Patent: May 20, 2014

(54) LIGHT-EMITTING DEVICE WITH HEAD-TO-TAIL P-TYPE AND N-TYPE TRANSISTORS

(71) Applicant: Commissariat A L'Energie Atomique Et Aux Energies Alternatives, Paris (FR)

(72) Inventors: Laurent Grenouillet, Rives (FR); Maud Vinet, Rives (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/670,882

(22) Filed: Nov. 7, 2012

(65) Prior Publication Data  
US 2013/0113004 A1 May 9, 2013

(30) Foreign Application Priority Data  
Nov. 8, 2011 (FR) ..................................... 11 60166

(51) Int. Cl.  
*H01L 33/00* (2010.01)

(52) U.S. Cl.  
USPC .................. 257/94; 257/96; 257/97; 257/523

(58) Field of Classification Search  
USPC ........................ 257/94, 96, 97, 523  
See application file for complete search history.

(56) References Cited

U.S. PATENT DOCUMENTS

| 4,905,059 | A | 2/1990 | Shur |
| 7,297,589 | B2 | 11/2007 | Feng |
| 2005/0247924 | A1 | 11/2005 | Atwater et al. |

OTHER PUBLICATIONS

French Preliminary Search Report issued Jul. 4, 2012 in U.S. Appl. No. 1160165 with English translation of categories of cited documents.  
P. Batude, et al., "3D Monolithic Integration", International Symposium on Circuits and Systems (ISCAS), IEEE 2011, XP0316998102A, May 16, 2011, pp. 2233-2236.

*Primary Examiner* — Tan N Tran  
(74) *Attorney, Agent, or Firm* — Oblon, Spivak, McClelland, Maier & Neustadt, L.L.P.

(57) ABSTRACT

A light-emitting microelectronic device including a first N-type transistor ($T_1$) and a second P-type transistor ($T_2$), the respective gates of which are formed opposite one another, either side of an intrinsic semiconductor material region.

10 Claims, 15 Drawing Sheets

LIGHT-EMITTING DEVICE WITH HEAD-TO-TAIL P-TYPE AND N-TYPE TRANSISTORS

TECHNICAL FIELD

Figure 1:
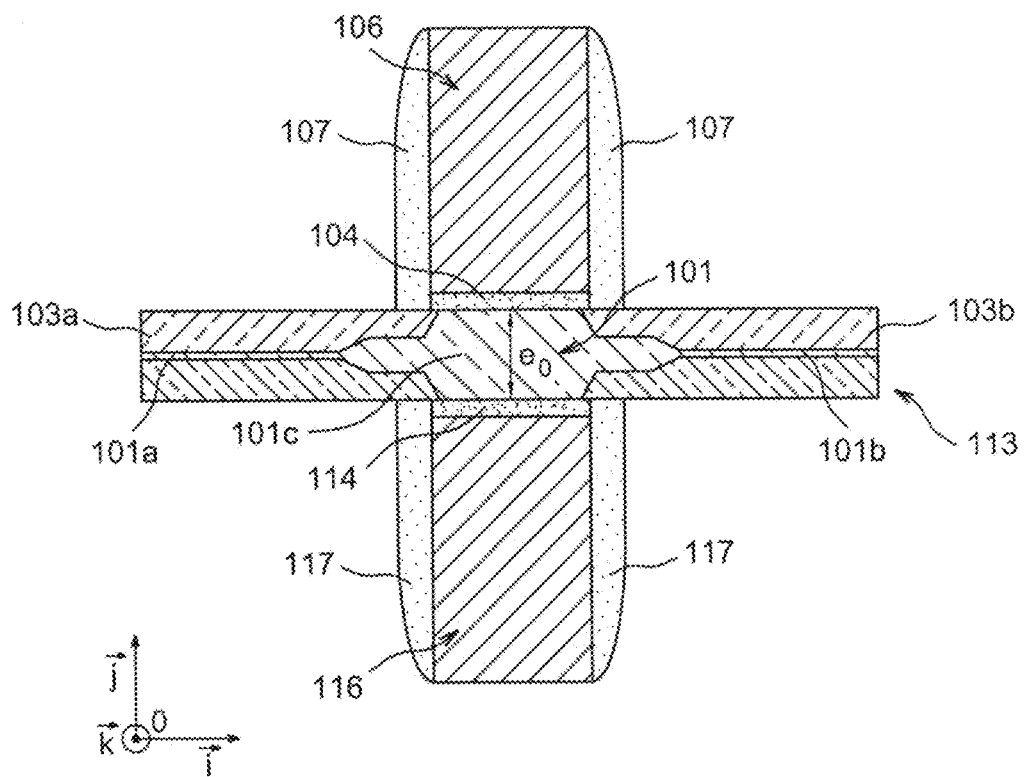

The present invention relates to the field of microelectronics and, more specifically, light-emitting microelectronic devices.

It concerns a light-emitting device enabling a luminous flux to be obtained which can vary over a broad range, whilst having an improved design in particular in terms of encumbrance.

PRIOR ART

It is well known to produce light-emitting diodes formed, for example, from a P-N junction or a P-I-N junction.

In such devices, electron-hole pairs are recombined in a region called a "space charge region", so as to create photons. Hetero-structures with quantum wells can be present in the space charge region, in order to increase recombination efficiency.

A quantum well can be produced using a stack of layers made of semiconductor materials with different gaps, including for example a layer made of a material with a small gap positioned between two layers of material with a larger gap.

Light-emitting transistors also exist, for example N-P-N bipolar transistors with a heterojunction, such as the one described in document U.S. Pat. No. 7,297,589.

Generally, it is constantly sought to make microelectronic light-emitting devices as compact as possible, in order that these devices may be integrated in known technologies, for example CMOS technology, and in order that these devices may be able to transpose an electrical signal into light information as rapidly as possible.

Document U.S. Pat. No. 4,905,059 A discloses a microelectronic light-emitting device having a first and second transistor the gates of which are positioned opposite one another, either side of a channel region made of a undoped semiconductor material.

The source and drain electrodes of the first transistor and of the second transistor are all positioned in the same plane, and with a cross configuration, such that the flow of charge carriers, in particular of holes, between the source and drain electrodes of the first transistor intersects and is orthogonal to the flow of charge carriers, particularly of the electrons, between the source and drain electrodes of the second transistor.

Such a device poses problems of encumbrance, and is also of limited efficiency for recombining the charge carriers.

DESCRIPTION OF THE INVENTION

The present invention relates to a microelectronic light-emitting device including at least one first transistor having source and drain regions formed in at least one first doped semiconductor N region and one gate, at least one second transistor having source and drain regions formed in at least one second doped semiconductor P region and one gate, where the gate of the first transistor and the gate of the second transistor are positioned opposite one another, either side of a region including a given region made of at least one intrinsic and/or undoped semiconductor material.

Such a device enables a current of holes and a current of electrons to be adjusted independently.

In a semiconductor region the electrons and the holes generally do not have the same ability to move or the same mobility. In a light-emitting diode only a single current flows, and the electron flow is therefore equal to the flow of holes. The latter, which generally move slowly, can limit the radiative recombination rate, and therefore the luminous flux.

According to the invention, the flows of electrons and holes can be adjusted independently by the manner in which the first said transistor and the second said transistor are biased. To increase the mobility of the holes in the device it is, for example, possible to increase the current generated in the channel of the second transistor. The number of recombinations of electron/hole pairs is increased by this means.

Such a device is compact, while enabling a light flow to be obtained which can vary over a broad range.

Such a device can be produced, for example, using CMOS technology.

The use of transistors in such a device differs from that of a conventional double-gate transistor structure, notably in terms of the doping of the source and drain regions.

The source and drain regions of the first transistor and of the second transistor can be designed with a particular layout such that a first axis passing through the source and drain regions of the first transistor, a second axis passing through the source and drain regions of the second transistor, and a third axis passing through said given region, are coplanar and mutually parallel.

It is thus possible to implement a first flow of a first type of charge carriers, for example of holes flowing in said given region, and a second flow of charge carriers of a second type flowing in said given region, in the same direction as that of the first flow.

This can enable the recombinations between charge carriers to be improved.

According to one implementation possibility, the source and drain regions of the first transistor can be located in a first plane containing said first axis, where the source and drain regions of the second transistor are located in a second plane containing said second axis, where said second plane is separate from said first plane, and parallel to said first plane, and where a source region of the first transistor is positioned opposite a source or drain region of the second transistor.

According to one variant, the source and drain regions of the first transistor can be located in the same plane as the source and drain regions of the second transistor.

According to one implementation possibility, the device can be designed such that the source region of the first transistor is positioned opposite the source region of the second transistor, where the drain region of the first transistor is positioned opposite the drain region of the second transistor.

By this means, charge carrier flows of different types may be implemented, where the flows are aligned with one another, but are in opposite directions in the given region located between the gates of the first and second transistors.

According to one implementation possibility, the first transistor and the second transistor can be symmetrical relative to a plane passing through said given region.

According to one implementation possibility, said given semiconductor region can include a direct-gap material.

Implementation of the given region using such a material can enable improved efficiency to be obtained in terms of photoemission.

According to one implementation possibility, said given region can be formed from a hetero-structure including a stack of at least one first semiconductor material, of at least one second semiconductor material having a different gap to that of the first semiconductor material, or from a stack formed from at least one first semiconductor material, from at least one second semiconductor material, and from at least one third semiconductor material, where the second semiconductor material is located between the first semiconductor material and the third semiconductor material, and has a gap which is smaller than that of said first and third semiconductor materials.

This can enable improved confinement of the carriers in the given region to be obtained. It can also enable the carriers to be located in a region where the recombinations will take place.

According to one possibility for implementation of the device, the source region of the first transistor can be positioned opposite and separated from a source or drain region of the second transistor by at least one insulating region, where the drain region of the first transistor is opposite and separated from a source or drain region of the second transistor by at least one other insulating region. These insulating regions can allow the implementation of a polarisation of the first transistor, where this polarisation is independent of that of the second transistor.

Said given region can be between 2 nm and 100 nm thick.

The present invention also relates to a method of production of a device such as defined above.

The present invention also relates to a method of production of a microelectronic light-emitting device including, in this order or in a different order, steps of:

production of at least one first transistor resting on a first substrate, where the first substrate includes a support layer, an insulating layer and a thin semiconductor layer, where the first transistor has source and drain regions formed in at least one N-doped semiconductor region, and one gate, formation of at least one second transistor resting on a second substrate, where the second substrate includes a support layer, an insulating layer and a thin semiconductor layer, where the second transistor has source and drain regions formed in at least one P-doped semiconductor region, and one gate, removal of the support layer and of said insulating layer of a given substrate which is either the first substrate or the second substrate, removal of the support layer of at least one given portion of the insulating layer of the other substrate, which is either the first substrate or the second substrate, where said given portion is removed so as to reveal the thin semiconductor layer opposite a gate of a given transistor which is either said first transistor or the second transistor, assembly of the thin semiconductor layer of said given substrate with said thin semiconductor layer of said other substrate, or with a given semiconductor material formed on said thin semiconductor layer of said other substrate, where the first transistor is positioned opposite the second transistor.

The removal of said given portion can be accomplished so as to form an aperture in the insulating layer revealing the thin semiconductor layer opposite a gate of a given transistor which is either said first transistor or the second transistor, where the method includes, prior to step c), growth of said semiconductor material on said thin semiconductor layer of the other said substrate, so as to cover the insulating layer of said other substrate.

The given semiconductor material can be a direct-gap material.

According to one implementation possibility, said given semiconductor material can be a material having a smaller gap than the material of said thin semiconductor layer of the first substrate and/or of the material of the thin semiconductor layer of the second substrate.

BRIEF DESCRIPTION OF THE ILLUSTRATIONS

Figure 2A:
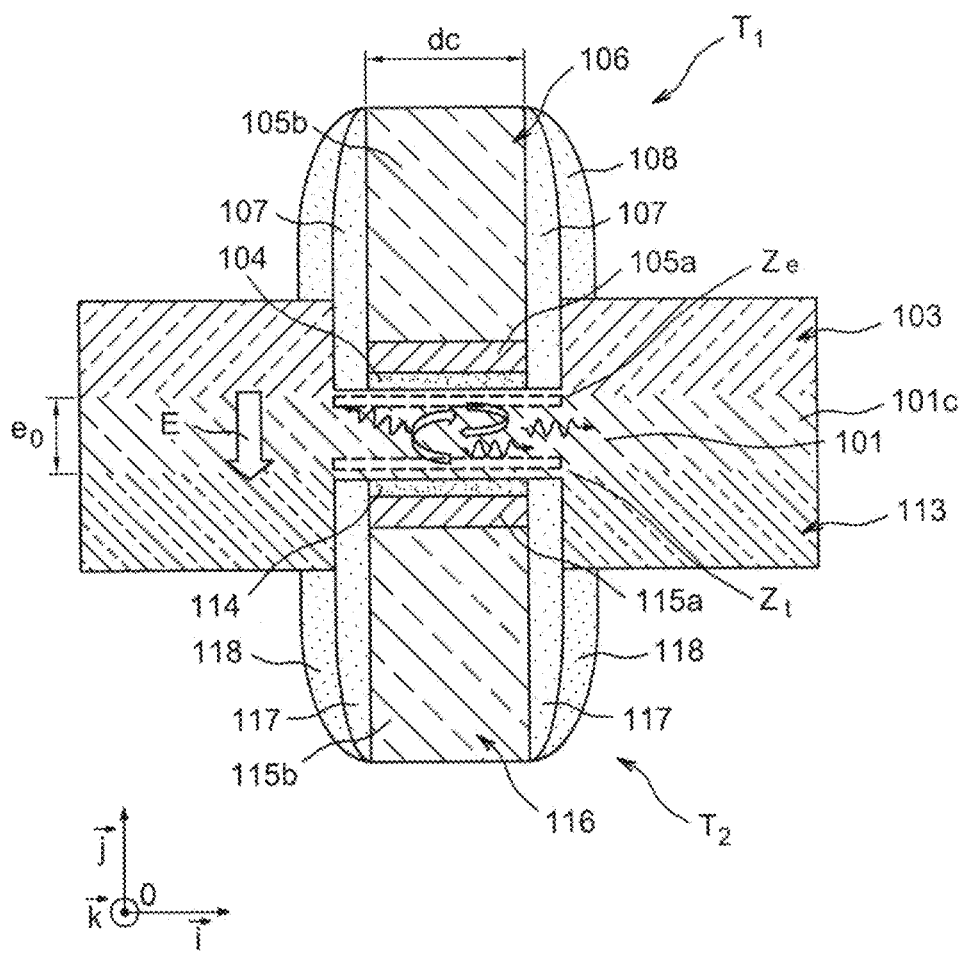
Figure 2B:
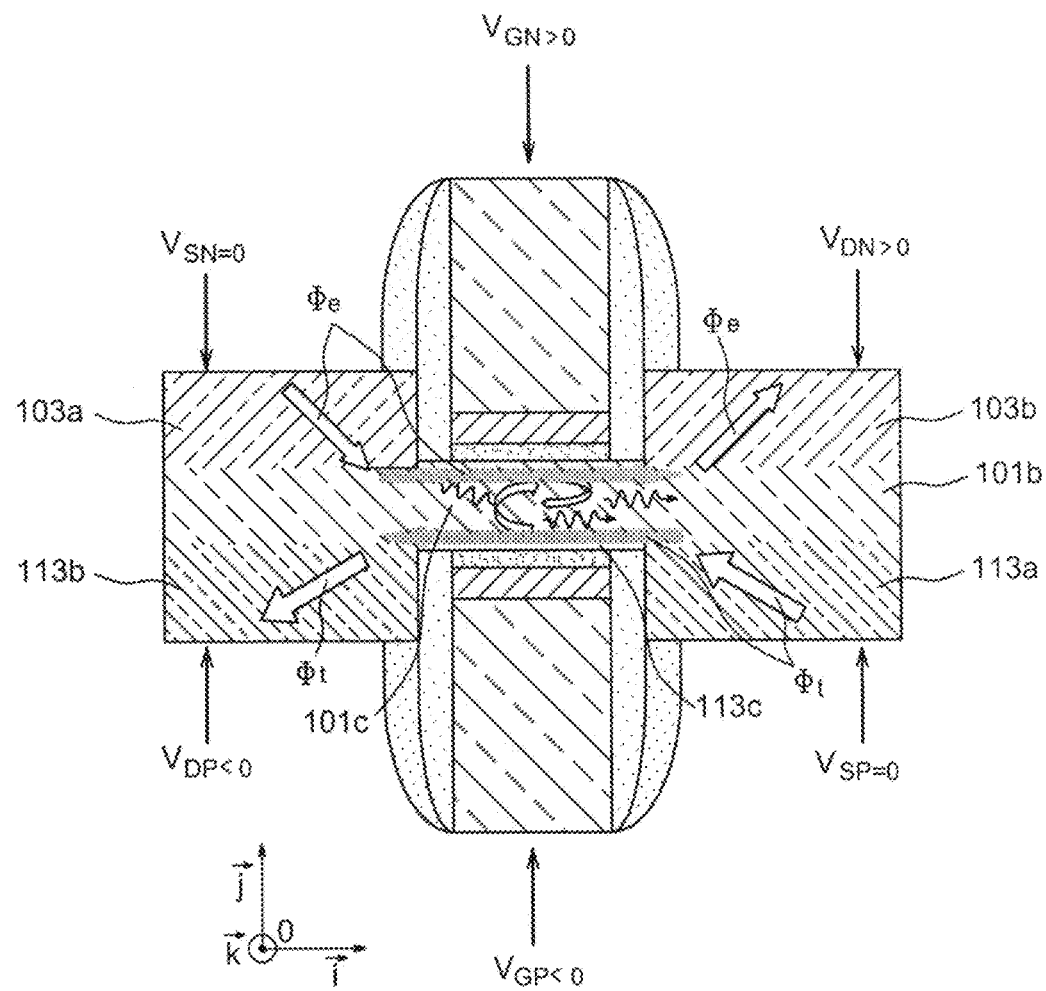
Figure 2C:
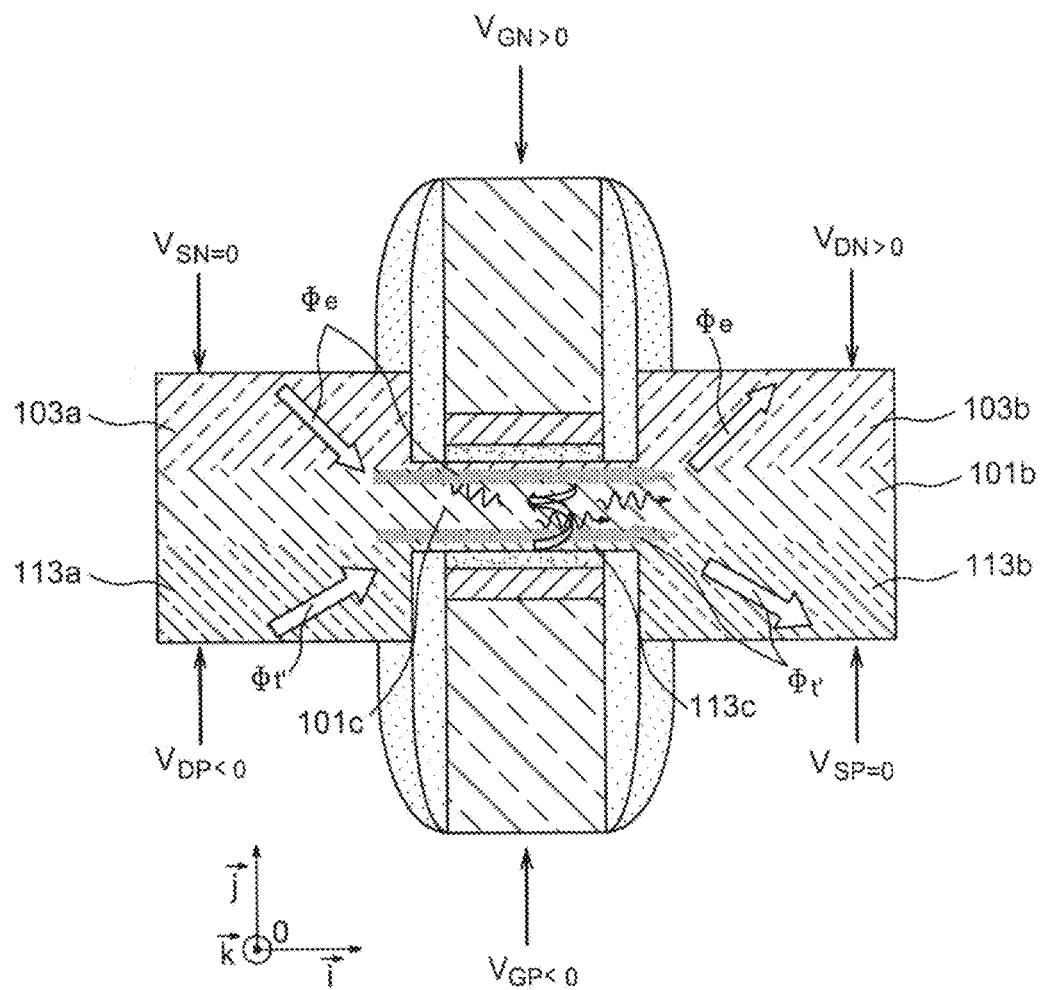
Figure 3:
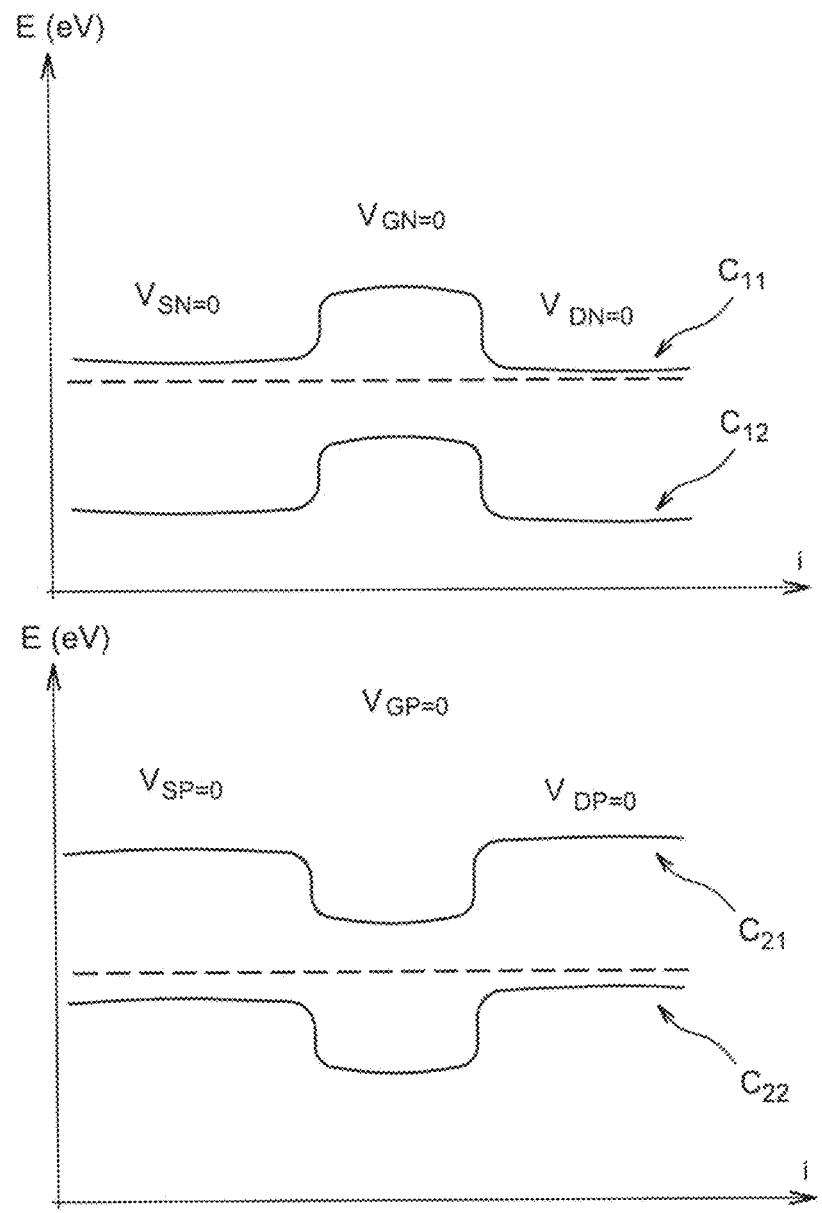
Figure 4:
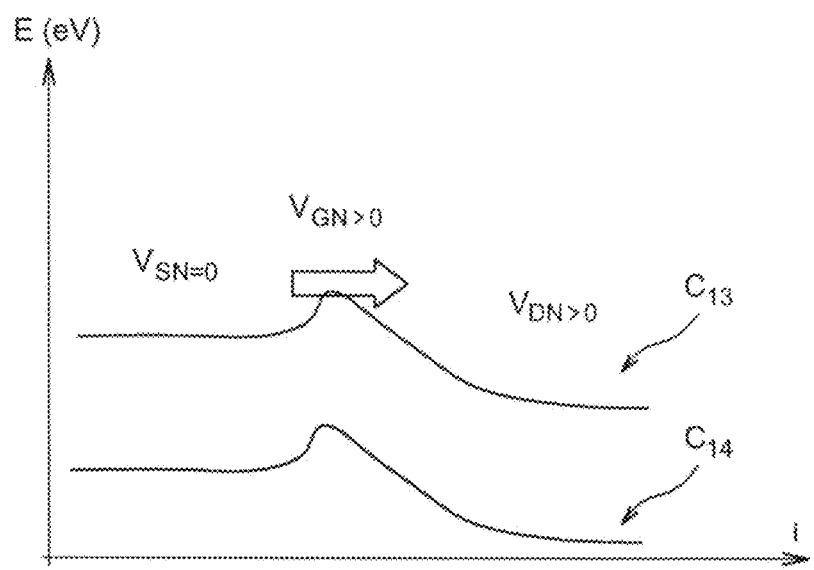
Figure 4:
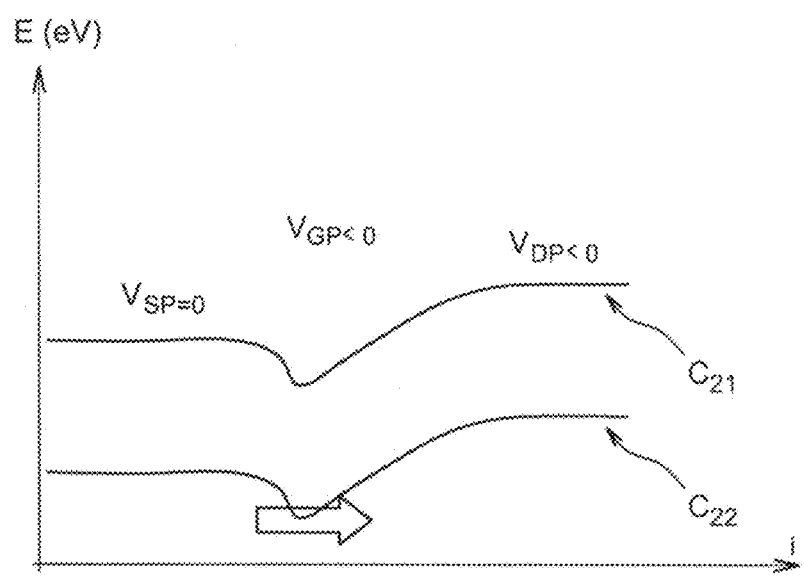
Figure 5:
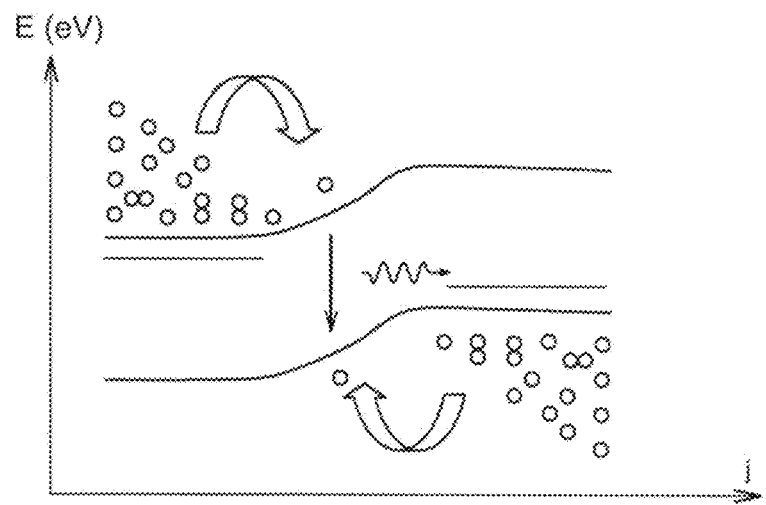
Figure 6:
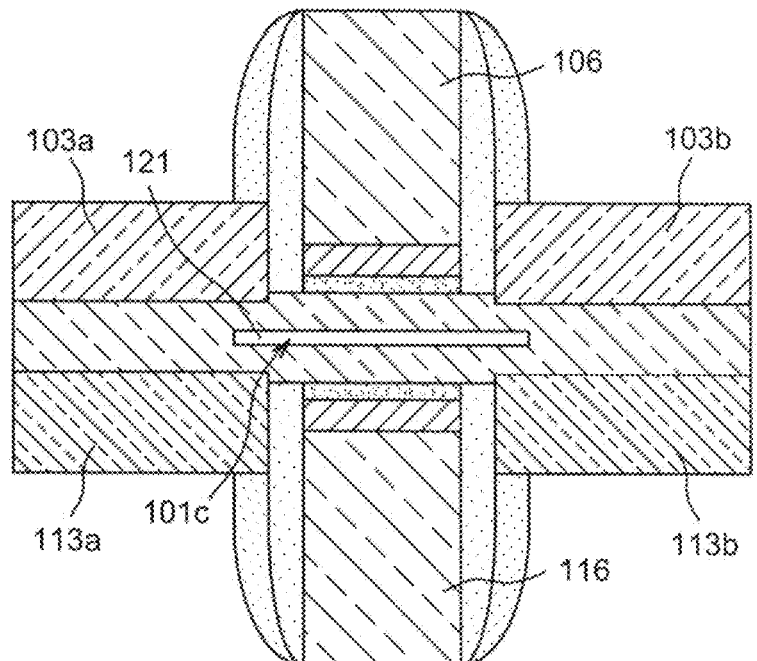
Figure 7:
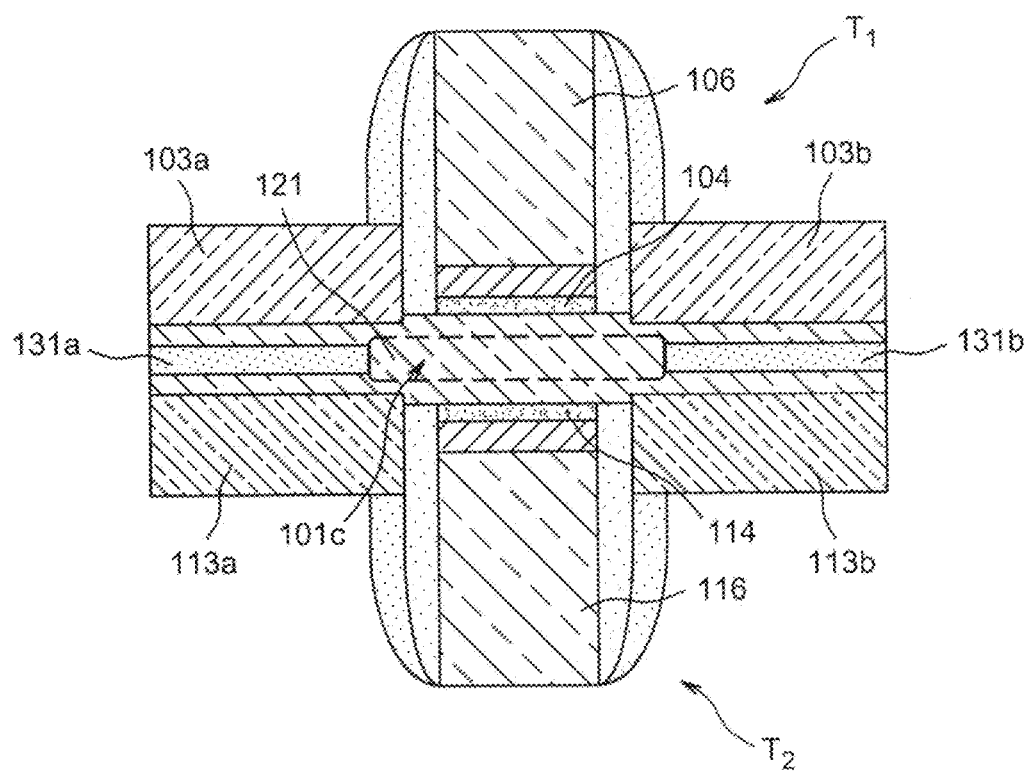
Figure 9A:
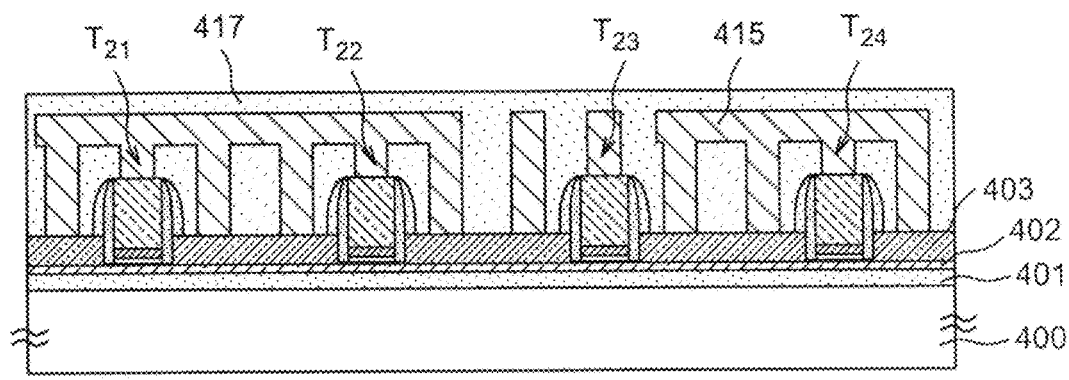
Figure 9B:
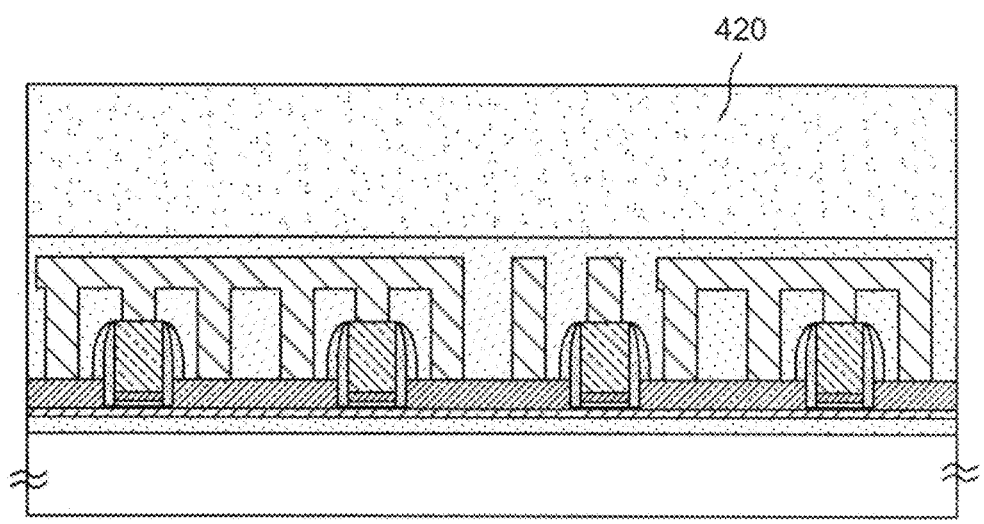
Figure 8C:
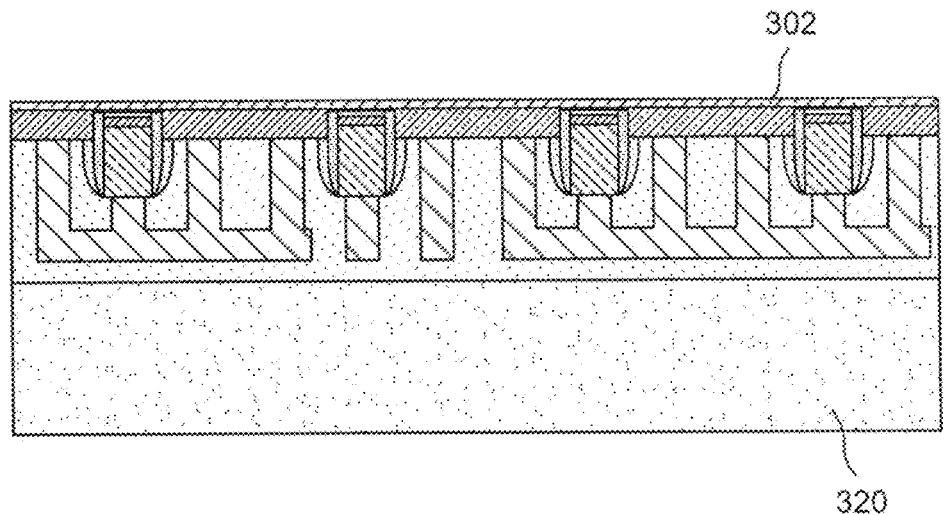
Figure 9C:
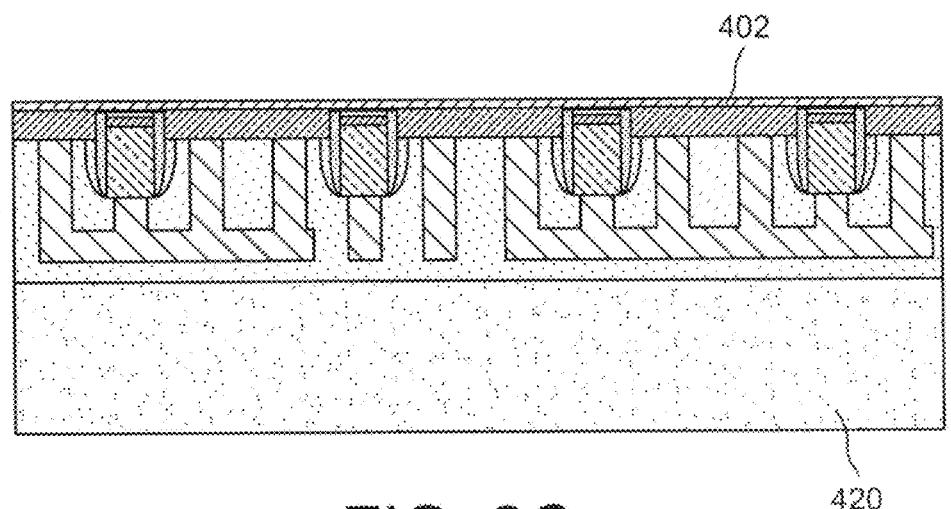
Figure 10A:
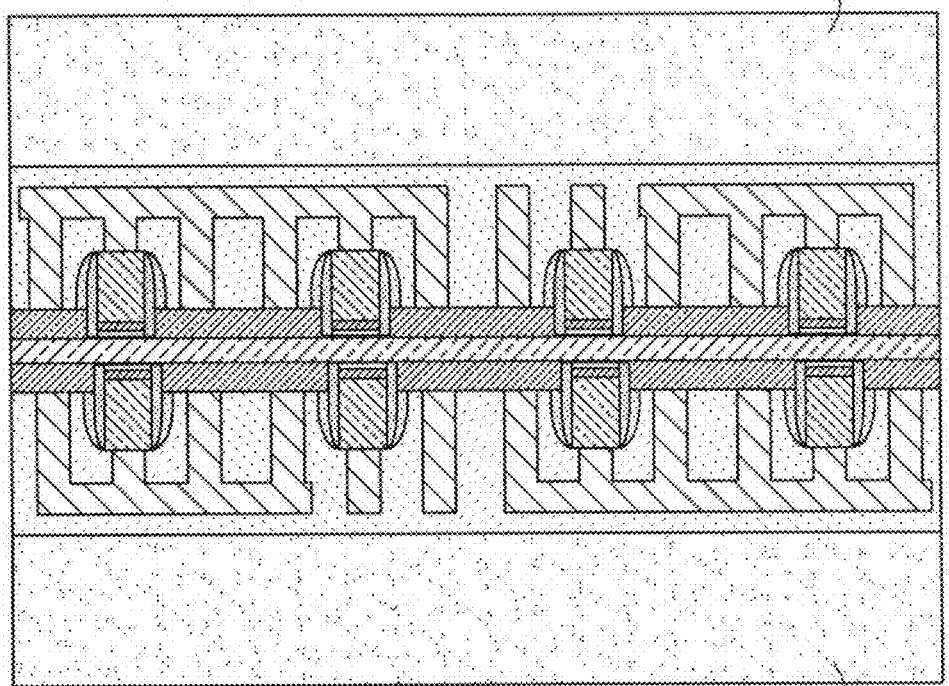
Figure 10B:
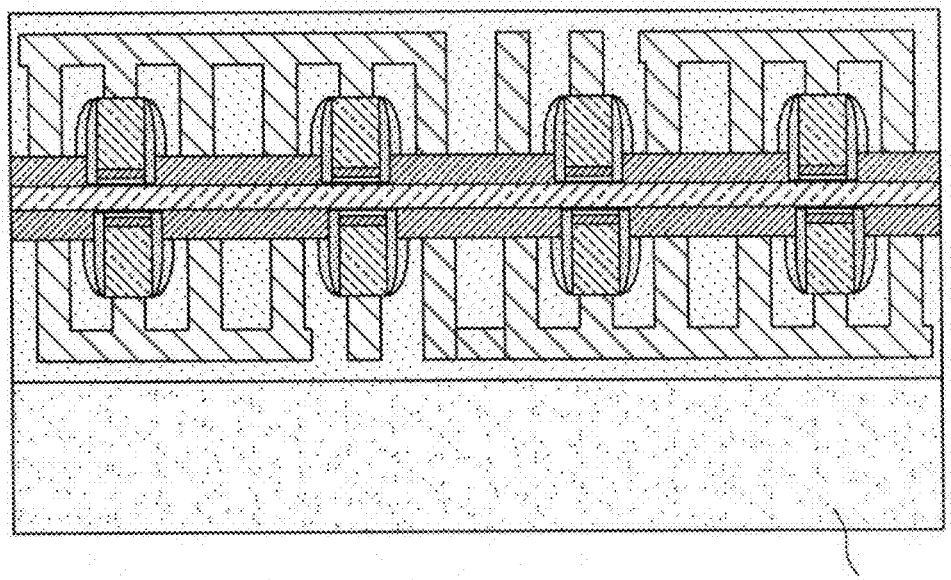
Figure 10C:
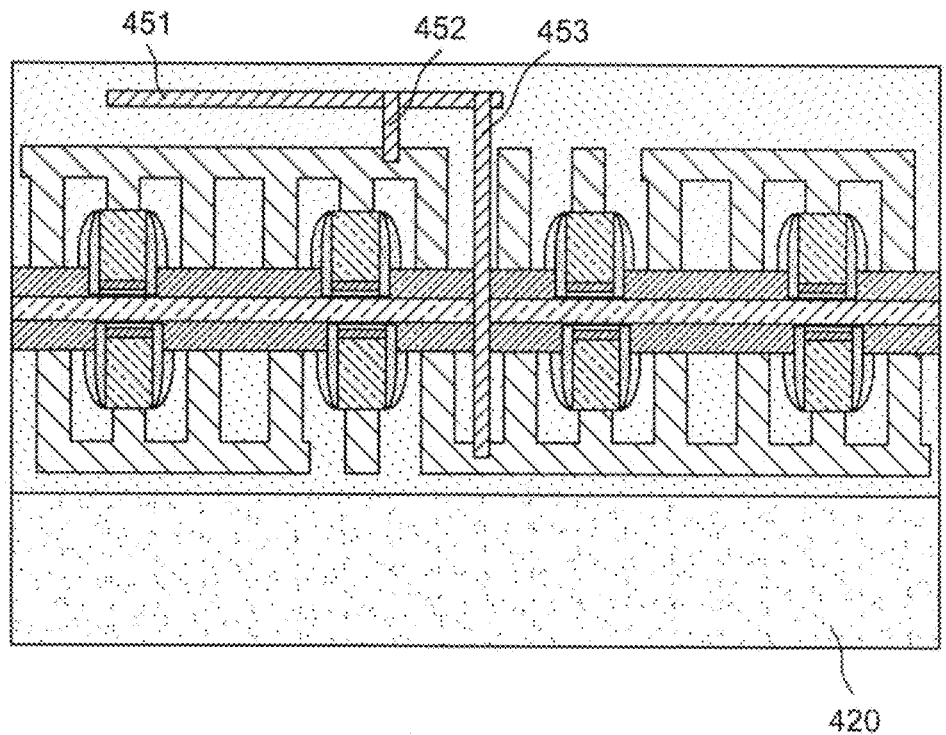
Figure 11A:
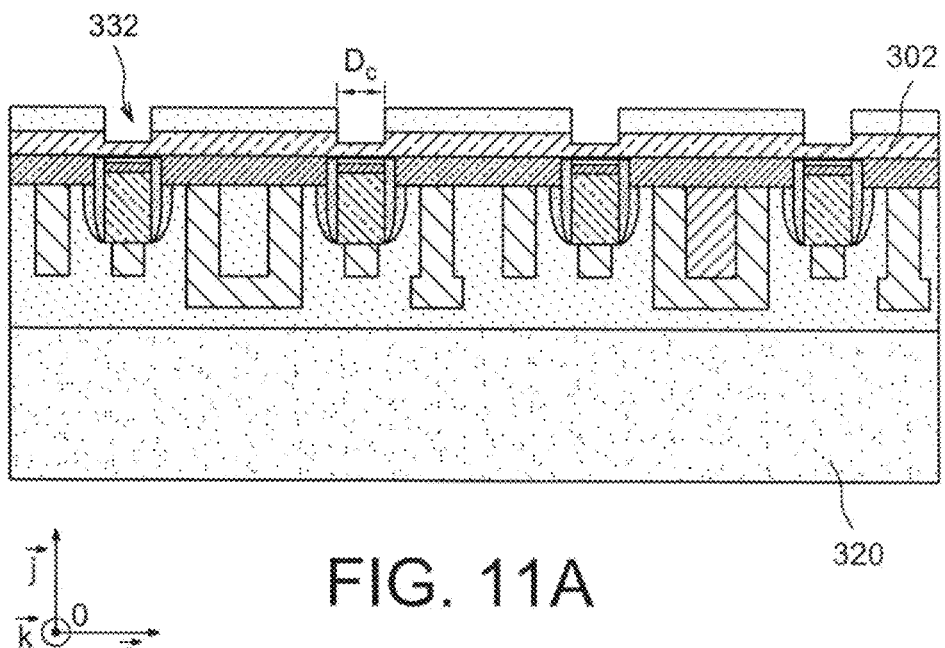
Figure 11B:
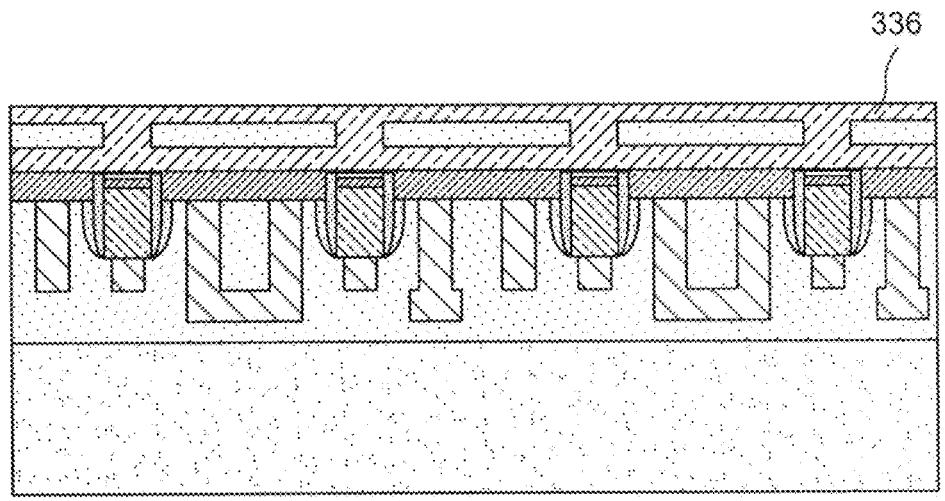
Figure 11C:
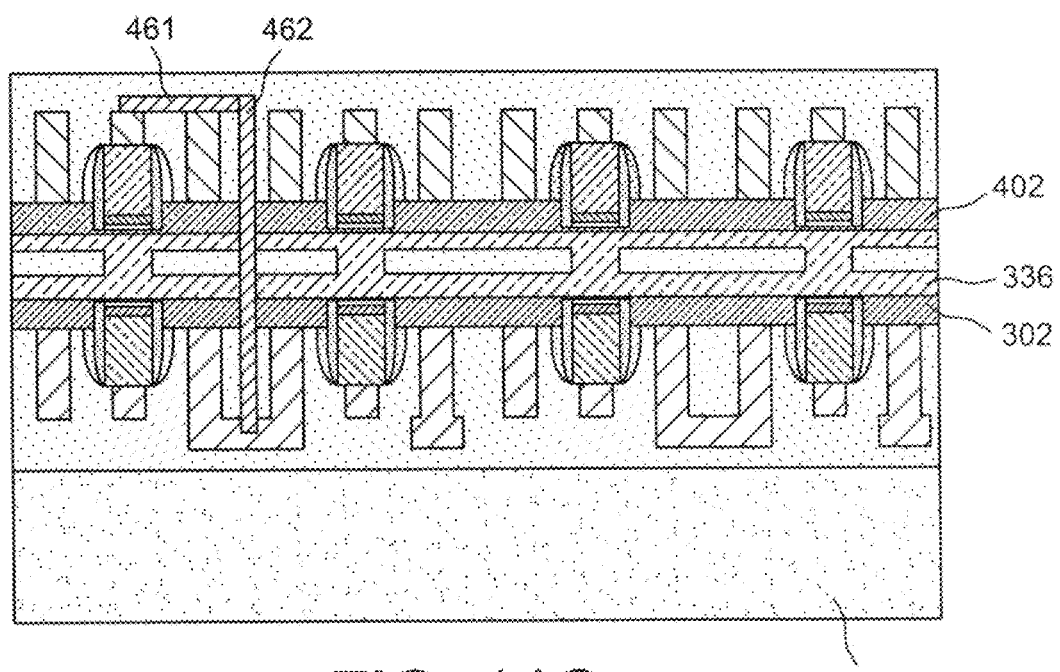
Figure 12A:
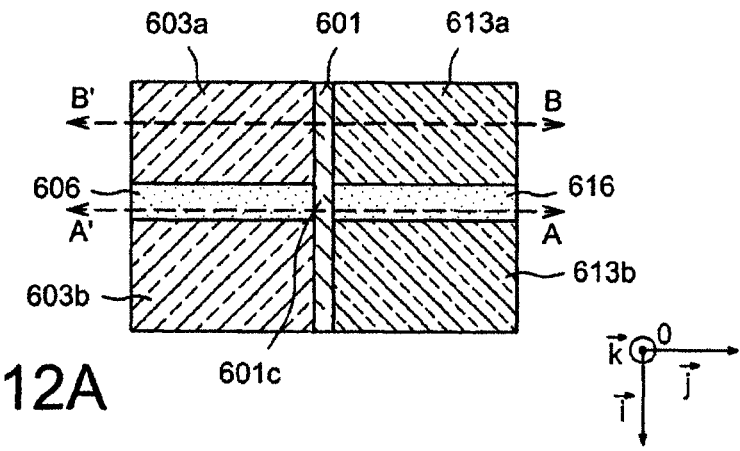
Figure 12B:
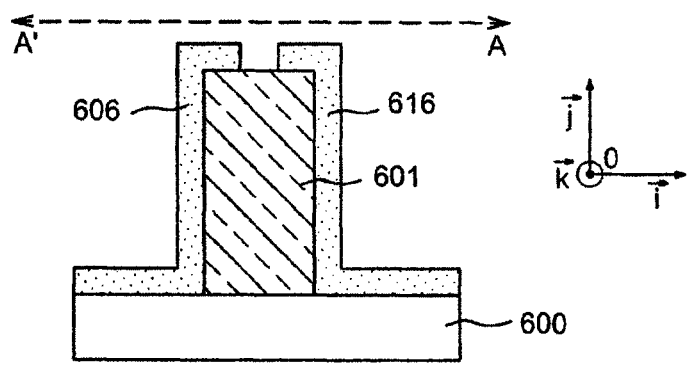
Figure 12C:
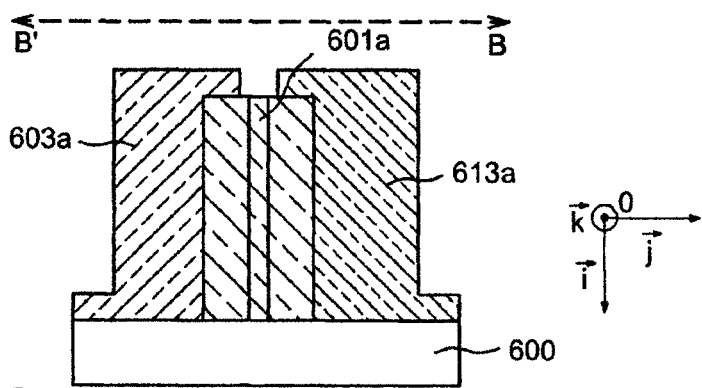

The present invention will be better understood on reading the description of examples of embodiment given, purely as an indication and in no sense restrictively, making reference to the annexed illustrations in which:

FIGS. 1, 2A, 2B, 2C illustrate examples of microelectronic light-emitting devices according to the invention, including two transistors, the respective gates of which are symmetrical and positioned head-to-tail relative to an intrinsic and/or undoped semiconductor region, FIGS. 3, 4, and 5 illustrate strip structures in a semiconductor region positioned between the gates of a microelectronic light-emitting device according to the invention, FIG. 6 illustrates an example of a microelectronic light-emitting device according to the invention, including a direct-gap material between the gates of its two transistors positioned opposite one another in a symmetrical manner and head-to-tail relative to one another, FIG. 7 illustrates an example of a microelectronic light-emitting device according to the invention formed from two transistors positioned opposite one another in a symmetrical manner and head-to-tail relative to one another, where the source and drain regions of the first transistor are insulated from the source and drain regions of the second transistor by insulating regions, FIGS. 8A-8C, 9A-9C, 10A-10C illustrate a first example method of production of a microelectronic device according to the invention, FIGS. 11A-11C illustrate a second example method of production of a microelectronic device according to the invention, FIGS. 12A-12C illustrate an example of a microelectronic light-emitting device according to the invention, including two transistors, the respective gates of which are symmetrical relative to a semiconductor region in the form of a semiconductor rod, Identical, similar or equivalent parts of the various figures have the same numerical references, to make it easier to go from one figure to another.

The various parts represented in the figures are not necessarily represented at a uniform scale, in order to make the figures more readable.

DETAILED ACCOUNT OF PARTICULAR EMBODIMENTS

A first example of a microelectronic light-emitting device according to the invention is illustrated in FIGS. 1, 2A-2C.

This device is formed from a first transistor $T_1$, the source and drain regions of which are formed in a region 103 made of a semiconductor material, and are doped with an N-type doping, and from a second transistor $T_2$, the source and drain regions of which are formed in a region 113 made of a semiconductor material, and are doped with a P-type doping.

In this example, zones 103, 113, respectively of N type and of P type, are positioned either side of an undoped semiconductor region 101 made of an intrinsic semiconductor material.

First transistor $T_1$ and second transistor $T_2$ are positioned opposite one another with respective gates 106, 116 positioned head-to-tail relative to one another.

First transistor $T_1$ and second transistor $T_2$ are positioned symmetrically relative to the main plane of semiconductor region 101 (where the main plane is one parallel to plane [O; $\vec{i}$; $\vec{k}$] of orthogonal marker [O; $\vec{i}$; $\vec{j}$; $\vec{k}$] defined in FIGS. 1 and 2A) positioned between transistors $T_1$, $T_2$, where gate 106 of first transistor $T_1$ is located opposite gate 116 of second transistor $T_2$ (FIGS. 1 and 2A).

In the example embodiment given in FIGS. 1, 2A-2C, region 101 positioned between active regions 103, 113 and gates 106, 116 of transistors $T_1$, $T_2$ can be fully semiconducting and undoped and/or made of an intrinsic semiconductor material.

This region 101 includes a region 101a of semiconductor material located between source region 103a of first transistor $T_1$ and a source or drain region of second transistor $T_2$, together with a region 101b of semiconductor material positioned between drain region 103b of first transistor $T_1$ and a drain or source region of second transistor $T_2$.

According to a particular implementation, regions 101a, 101b of region 101 may possibly have zero thickness.

Regions 101a and 101b can have a thickness (measured in a direction parallel to vector $\vec{j}$ of orthogonal marker [O; $\vec{i}$; $\vec{j}$; $\vec{k}$] defined in FIGS. 1, 2A-2C) of between, for example, 0 and 50 nm.

In a region located between gates 106, 116, and in particular in given region 101c of semiconductor region 101 of intrinsic semiconductor material located between gates 106, 116 and between regions 101a and 101b, electron-hole pairs may be recombined radiatively when the transistors are at the "ON" state, and when a current passes between the source and the drain of a given transistor.

Region 101c, and in this example entire semiconductor region 101, may be made from intrinsic Si.

The N-doped regions and the P-doped regions preferably do not extend between gates 106 and 116 of first transistor $T_1$ and of second transistor $T_2$.

Semiconductor region 101, and in particular region 101c of this region 101, can be designed with a thickness $e_0$ (measured in a direction parallel to vector $\vec{j}$ of orthogonal marker [O; $\vec{i}$; $\vec{j}$; $\vec{k}$]) for example of the order of 10 nm or between, for example, a value $e_{min}$, for example of the order of 3 nm, and a value $e_{max}$, for example of the order of 100 nm.

Thickness $e_0$ can be chosen with a minimum value $e_{min}$ enabling an inversion to be obtained, i.e. enabling a channel of electrons to be obtained in a region which will be called the "front face" of region 101c of the semiconductor region, and which is located close to gate 106 of first transistor $T_1$, and enabling an accumulation to be obtained in a region which will be called the "rear face" of region 101c of semiconductor region 101, and which is located close to gate 116 of second transistor $T_2$, in particular when region 101c is undoped, and has been formed from a plate including an intrinsic semiconductor material and/or a material having a P-type residual doping.

The terms "inversion" and "accumulation" are understood here relative to a reference Si substrate which is undoped or which includes a P-type residual doping. If the original substrate is actually undoped there may be an electron inversion layer in the front face and a hole inversion layer in the rear face.

To this end, for example if region 101 is made of Si, thickness $e_{min}$, also called the critical thickness, and noted $T^*_{Si}$, may be defined, for example, using the following formula when voltage Vg2 applied to the front face of the transistor is greater than the threshold voltage of the front face when the front face is inverted:

$$T^*_{Si} = \frac{KT}{q} \frac{\epsilon_{SI}}{C_{BOX}(V_{FB2} - V_{G2})} \ln\left[\frac{N_a C_{OX} C_{BOX}(V_{FB2} - V_{G2})}{q\epsilon_{SI} n_i^2}\right]. \quad (7)$$

With k the Boltzmann constant, T the temperature, $\in$ is the dielectric constant of silicon, Cox and Cbox the oxide capacities of the NMOS transistor and of the PMOS transistor respectively, and Vfb2 and Vg2 the flat band and gate voltages applied to the PMOS transistor.

Maximum value $e_{max}$ at which thickness $e_0$ may be set such that at a point of the channel the electrons and the holes are separated by less than the Bohr radius of an exciton. In the case of most semiconductor materials, the Bohr radius of the exciton is of the order of some ten nanometers.

Both the source and drain regions of the first transistor are opposite a source or drain region of the second transistor, and are located in the same plane, where this plane is different from that in which the source and drain regions of the second transistor are positioned, and is parallel to that in which the source and drain regions of the second transistor are positioned.

The source and drain regions of the first transistor and of the second transistor are, in particular, arranged such that a first axis X'X passing through the source and drain regions of the first transistor and parallel to the channel of the first and second transistor is coplanar and parallel with a second axis Y'Y passing through the source and drain regions of the second transistor, where the first axis X'X, the second axis Y'Y, and a third axis Z'Z passing through given region 101c are coplanar and parallel.

With such an arrangement of the source and drain regions, the charge carrier flow between the source and drain region of the first transistor, and observed in region 101c, has the same direction as, or a direction parallel to, that of the charge carrier flow between the source and drain region of the second transistor, and observed in region 101c, enabling recombinations of carriers to be improved, and consequently enabling the photon emission efficiency to be improved.

Gates 106 and 116 belonging respectively to first transistor $T_1$ and to second transistor $T_2$ are separated from one another by a stack including: a gate dielectric region 104, region 101c of intrinsic semiconductor region 101, a second gate dielectric region 114.

Gates 106 and 116 can be designed with a length also called a "critical dimension", dc, (measured in a direction parallel to vector I of orthogonal marker [O; $\vec{i}$; $\vec{j}$; $\vec{k}$]) of between, for example, 10 nm and 10 μm, for example of the order of 100 nm.

Gate dielectric regions 104 and 114 can be made, for example, of $SiO_2$, $HfO_2$ or HfSiON.

Gates 106, 116 can be formed, for example, from a semiconductor block, for example made of polysilicon (FIG. 1) or possibly be formed (FIGS. 2A-2C) from a stack of several blocks 105a-105b, 115a-115b.

In this case, gates 106, 116 can be formed, for example, from a first block 105a, 115a made of metal such as, for example, titanium nitride or tantalum nitride, and from a second block 105b, 115b covering the first block and made, for example, of polysilicon, in order to adjust the respective output work properties and resistivity properties of gates 106, 116.

Each of gates 106, 116 is surrounded on either side by insulating regions forming spacers. Insulating regions 107 which are partially buried in semiconductor region 103 of first transistor $T_1$ can be installed against the sides of first gate electrode 106, whereas insulating regions 117 which are partially buried in semiconductor region 113 of second transistor $T_2$ can be installed against sides of second gate electrode 116.

The source and drain regions may possibly be raised relative to the semiconductor layer of the channel.

According to one implementation possibility illustrated in FIGS. 2A-2C, transistors $T_1$ and $T_2$ can also have other insulating regions 108, 118, respectively against insulating regions 107 and 117.

In the embodiment example of FIG. 2A, regions Ze and Zt, in which electrons and holes are respectively intended to be channelled, are illustrated in the case in which a transverse field E is generated by an appropriate polarisation of the source and drain regions, together with gates 106, 116 of transistors $T_1$ and $T_2$.

By adjusting the source and drain polarisations of transistors $T_1$ and $T_2$, these Ze and Zt regions of electrons and of holes are created by a field effect, and make the electron-hole recombinations possible so as to create photons within a given channel shared by both transistors $T_1$ and $T_2$.

The device may be put into a mode known as a "weak inversion" mode, for example by polarising the gate of first transistor $T_1$ with a positive potential greater than and close to its threshold voltage, and by polarising the gate of second transistor $T_2$ with a negative potential close to its threshold voltage, where the inversion regions are as far as possible from gates 106, 116.

It is also possible, and preferable, to establish polarisation conditions for which, at a point of the channel, the electrons and the holes are separated from one another by less than the Bohr radius of an exciton.

In the example embodiment of FIG. 2B, the light-emitting microelectronic device is designed such that source region 103a of first transistor $T_1$ is positioned opposite drain region 113b of second transistor $T_2$, whereas drain region drain 103b of first transistor $T_1$ and source region 113a of second transistor $T_2$ are positioned opposite one another.

An electron flow (De from source 103a towards drain 103b of first transistor $T_1$ is illustrated in FIG. 2B by a first succession of arrows, whereas a flow of holes φt (illustrated by a second succession of arrows φt), opposite to flow φe, moves from source 103a towards drain 103b of first transistor $T_1$.

In region 101c located between gates 106, 116, made of an intrinsic semiconductor material, flows φt and φe are along the same axis, but in opposite directions.

To generate electron flow φe, the polarisation of first transistor $T_1$ can be such that its source 103a is put, for example, at a potential $V_{SN}=0$, whereas its gate 106 is put, for example, at a potential $V_{GN}>0$, and its drain 103b is put, for example, at a potential $V_{DN}>0$.

To generate flow of holes φt, the polarisation of second transistor $T_2$ can be such that its source 103a is put, for example, at a potential $V_{SP}=0$ (or greater than 0), whereas its gate 106 is put, for example, at a potential $V_{GP}<0$ (or equal to 0, respectively), and its drain 103b is put, for example, at a potential $V_{DP}<0$.

Flow of holes φt and electron flow φe can be modulated independently of one another.

Another embodiment of the light-emitting microelectronic device according to the invention is illustrated in FIG. 2C.

In this example, the light-emitting device is designed such source region 103a of first transistor $T_1$ is positioned opposite source region 113a of second transistor $T_2$, whereas drain region 103b of first transistor $T_1$ and drain region 103b of second transistor $T_2$ are positioned opposite one another.

In this manner, flows of electrons and holes in the same direction can be generated (an electron flow from source 103a towards drain 103b of first transistor $T_1$ is indicated in FIG. 1C by a first succession of arrows φe, whereas a flow of holes from source 103a towards drain 103b of first transistor $T_1$ is indicated by a second succession of arrows φ't).

In region 101c located between gates 106, 116, made of an intrinsic semiconductor material, flows φt and φe, which are along the same axis, and in the same direction, are thus implemented.

To generate electron flow φe, the polarisation of first transistor $T_1$ can be such that its source 103a is put, for example, at a potential $V_{SN}=0$, whereas its gate 106 is put, for example, at a potential $V_{GN}>0$, and its drain 103b is put, for example, at a potential $V_{DN}>0$. To generate flow of holes φ't, the polarisation of second transistor $T_2$ can be such that its source 103a is put, for example, at a potential $V_{SP}=0$, whereas its gate 106 is put, for example, at a potential $V_{GP}<0$, and its drain 103b is put, for example, at a potential $V_{DP}<0$.

With such a device it is possible to adjust independently a current of holes and a current of electrons according to the respective polarisations of first transistor $T_1$ and of second transistor $T_2$.

A controlled modulation of the current of electrons by the NMOS transistor and of the current of holes by the PMOS transistor can be accomplished over several orders of magnitude, so as to control the luminous flux across a broad range.

In FIG. 3, curves $C_{11}$, $C_{12}$ which are representative of bandgaps (conduction band $E_c$ for $C_{11}$, valence band $E_v$ for $C_{12}$) of a channel region of first transistor $T_1$ in the direction of the length of this channel region (i.e. in a direction parallel to vector $\vec{i}$ of orthogonal marker [O; $\vec{i}$; $\vec{j}$; $\vec{k}$]) when first transistor $T_1$ is not biased and $V_{SN}=0$, $V_{GN}=0$, and $V_{DN}=0$, are given.

Curves $C_{21}$, $C_{22}$ represent in this figure bandgaps (conduction band $E_c$ for $C_{21}$, valence band $E_v$ for $C_{22}$) of a channel region of second transistor $T_2$ in the direction of its length (i.e. in a direction parallel to vector $\vec{i}$ of orthogonal marker [O; $\vec{i}$; $\vec{j}$; $\vec{k}$]) when second transistor $T_2$ is not biased and $V_{SP}=0$, $V_{GP}=0$, and $V_{DP}=0$.

In FIG. 4, curves $C_{13}$, $C_{14}$ which are representative of bandgaps of a channel region of first transistor $T_1$ in the direction of the length of this channel region (i.e. in a direction parallel to vector $\vec{i}$ of orthogonal marker [O; $\vec{i}$; $\vec{j}$; $\vec{k}$]) when first transistor $T_1$ is biased with polarisation voltages of between 0 and 5V, such that $V_{SN}=0$, $V_{GN}>0$, and $V_{DN}>0$, are given.

Curves $C_{23}$, $C_{24}$ represent in this figure bandgaps of a channel region of second transistor $T_2$ in the direction of its length (i.e. in a direction parallel to vector $\vec{i}$ of orthogonal marker [O; $\vec{i}$; $\vec{j}$; $\vec{k}$]) when second transistor $T_2$ with polarisation voltages, as absolute values, of between 0 and 5V, such that $V_{SP}=0$, $V_{GP}<0$, and $V_{DP}<0$, are also given.

In FIG. 5, a bandgap of the common channel region located between gates 106 and 116 of transistors $T_1$, and $T_2$ in a vertical direction (i.e. in a direction parallel to vector $\vec{j}$ of orthogonal marker [O; $\vec{i}$; $\vec{j}$; $\vec{k}$]) notably illustrates the P-N or P-I-N pseudo-junction created in this region, together with the phenomenon of radiative recombinations between electrons in the channel region populated with electrons and the channel region populated with holes.

According to one implementation possibility of the microelectronic device according to the invention illustrated in FIG. 6, semiconductor region 101 and in particular semiconductor region 101c of this region 101 positioned between gates 106, 116, can be formed from a direct-gap semiconductor material, or include a direct-gap semiconductor material, for example a III-V material such as, for example, InGaAs or InGaAsP or InGaN, or a II-VI material such as, for example, CdHgTe, or again from semiconductor quantum dots. Implementation of such a region 101a can enable improved efficiency to be obtained in terms of photoemission.

Region 101c located between gates 106, 116 may possibly be formed from a stack of several semiconductor layers, for example from a layer of Si and a layer of SiGe, or for example from an Si/InP stack or from a InP/InGaAs stack, or from a InGaAs stack with different In and Ga compositions. The choice of the materials of region 101c depends notably on the wavelength which it is desired to emit.

According to one implementation possibility (FIG. 6), semiconductor region 101c positioned between the gates of transistors $T_1$ and $T_2$ can be designed such that it is formed from a hetero-structure including a stack 121 of at least a first semiconductor material, at least a second semiconductor material, and at least a third semiconductor material, where the second semiconductor material is located between the first semiconductor material and the third semiconductor material, and has a smaller gap than that of said first and third semiconductor materials. The first semiconductor material can be, for example, $In_xGa_{1-x}As$, the second semiconductor material can be, for example, $In_xGa_{1-x}As_{1-y}P_y$, while the third semiconductor material can be, for example, $In_xGa_{1-x}As$.

One or other of the following stacks: $In_xGa_{1-x}As/In_yGa_{1-y}As/In_xGa_{1-x}As$ where y>x, or $In_xGa_{1-x}As/In_xGa_{1-x}As_{1-y}P_y/In_xGa_{1-x}As$ or $Si/Si_{1-x}Ge_x/Si$, or Si/nanocrystals made of Si/Si or $CdTe/Cd_{1-x}Hg_xTe/CdTe$, can also be used.

Implementation of such a region 101a can enable improved confinement of the carriers in region 101c to be obtained. It can also enable the carriers to be located in a region where the recombinations will take place.

According to a variant, semiconductor region 101c positioned between the gates of transistors $T_1$ and $T_2$ can be designed such that it is formed from a hetero-structure including a stack of at least one semiconductor material such as silicon, and at least one second semiconductor material such as, for example, SiGe, having a smaller gap than that of the semiconductor material.

A variant of the light-emitting microelectronic device which has just been described is given in FIG. 7.

In the case of this variant there are insulating regions 131a, 131b between semiconductor regions 103 and 113.

These insulating regions 131a, 131b, are positioned either side of region 101a of intrinsic semiconductor material located between gates 106, 116 of transistors $T_1$, $T_2$ and which can, for example, be made of a direct-gap semiconductor material.

A first insulating region 131a is designed between a source region 103a of first transistor $T_1$, and another region, whether source or drain, of second transistor $T_2$, and which is located opposite source region 103a of first transistor $T_1$. A second insulating region 131b, for its part, is positioned between a drain region 103b of first transistor $T_1$, and another drain or source region of the other transistor.

In the case of this variant embodiment, control of the transistor can advantageously be decorrelated from that of the PIN junction.

According to a particular implementation of the device according to the invention, the latter can equally be subject to a pulsed polarisation mode, enabling the position of the carriers to be modulated, by applying, for example, a variable voltage to the gate of the transistors, where the frequency of this alternative voltage can be, for example, between 10 Hz and 1 GHz.

Such an embodiment can be of use notably when the channel is thin, and when it is difficult to create two inversion layers permanently and simultaneously.

An example of a method of production of a light-emitting device according to the invention and of the type previously described in connection with FIGS. 1, 2A-2C, will now be given in connection with FIGS. 8A-8C, 9A-9C, and 10A-10C.

Firstly, one or more transistors $T_{11}$, $T_{12}$, $T_{13}$, $T_{14}$ is/are produced on a first substrate of the semiconductor-on-insulator type, for example of the SOI ("Silicon On Insulator") type, including a sacrificial support layer 300, a thin insulating layer 301 resting on support layer 300, and a thin semiconductor layer 302 resting on insulating layer 301.

Figure 8A:
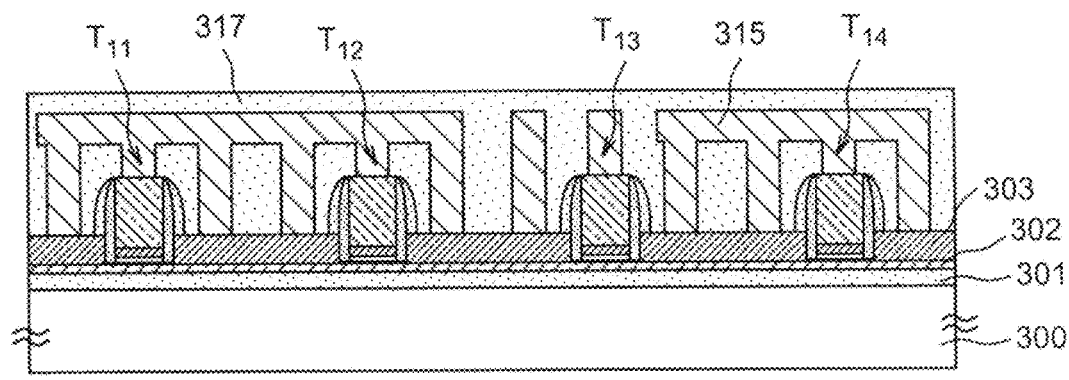

Transistors $T_{11}$, $T_{12}$, $T_{13}$, $T_{14}$ have source and drain regions which are formed in a region 303 made of a semiconductor material doped with an N-type doping. This N-doped region 303 can be produced on thin semiconductor layer 302 which, for its part, can be undoped or made of an intrinsic semiconductor material (FIG. 8A).

Figure 8B:
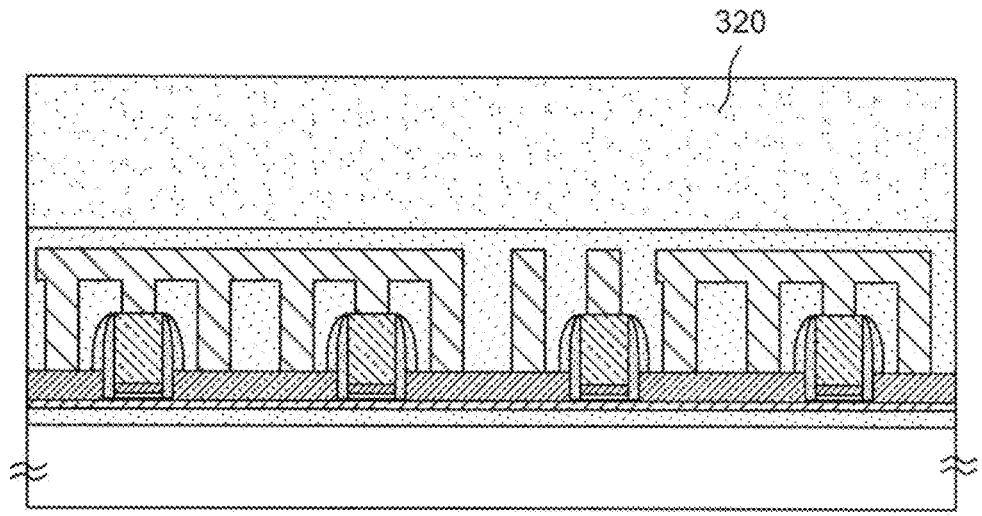

One or more transistors $T_{21}$, $T_{22}$, $T_{23}$, $T_{24}$ is/are produced on a second substrate of the semiconductor-on-insulator type, for example of the SOI type, including a sacrificial support layer 400, a thin insulating layer 401 resting on support layer 400, and a thin semiconductor layer 402 resting on insulating layer 401. Thin semiconductor layer 402. Transistors $T_{21}$, $T_{22}$, $T_{23}$, $T_{24}$ have source and drain regions which are formed in a region 113 made of a semiconductor material doped with a P-type doping. This P-doped region 403 can be produced on thin semiconductor layer 402 which, for its part, can be undoped or made of an intrinsic semiconductor material (FIG. 8B).

Thin insulator layers 301, 401 can, for example, be made of $SiO_2$ and have a thickness which is less than or equal to 25 nanometers or less than or equal to 10 nanometers. Thin semiconductor layers 302, 402 can, for their part, be designed with a thickness of, for example, between 2 nm and 100 nm, for example of the order of 10 nanometers.

NMOS transistors $T_{11}$, $T_{12}$, $T_{13}$, $T_{14}$ on the first substrate and PMOS transistors $T_{21}$, $T_{22}$, $T_{23}$, $T_{24}$ on the second substrate can have been formed using UTBB ("Ultra Thin Body and Box") technology.

On the first substrate and on the second substrate, one or more metal levels 315 and 415 for interconnecting the transistors can then be formed in at least one insulating layer 317 and 417 or in a stack of insulating layers on top of the transistors (FIGS. 8A and 9A).

Handle layers 320 and 420 are then formed, respectively, on the insulating layer(s) covering the first substrate and the second substrate. These handle layers 320 and 420 can be made, for example, of a polymer material.

Handle layers 320, 420 facilitate gripping of the circuits during production, and will be able to act as a temporary support. Handle layers 320, 420 may possibly be formed by molecular bonding of a plate on the top of the circuits during production (FIGS. 8B, 9B).

Respective sacrificial support layers 300 and 400 are then removed from the first substrate and the second substrate, together with insulating layers 301 and 401.

Support layers 300 and 400 can be removed, for example, by a polishing method commonly called a grinding or honing method, and a chemical etching, for example using TMAH ("Tetra-Methyl Ammonium Hydroxide"), in particular when support layers 300, 400 are made of Si, where a stop is made respectively on insulating layer 301 and insulating layer 401. Insulating layers 301, 401 are then removed, for example using HF.

After this removal, thin semiconductor layer 302 of the first substrate and thin semiconductor layer 402 of the second substrate are revealed.

It is then possible to form on thin semiconductor layers 302, 402, for example by growth, a direct-gap semiconductor material and/or a semiconductor material with a smaller gap than that of layers 302 and 402.

The two substrates are then subjected to bonding by placing thin layers 302, 402, or the semiconductor materials formed respectively on the latter, one against the other (FIG. 10A).

One of handle layers 320, 420 is then removed, whilst the other handle layer is retained. For example, handle layer 420 formed on the second substrate may be the one removed, whereas handle layer 320 of the first substrate is retained (FIG. 10B).

Connections can then be formed, for example in the form of at least one metal line 451 and vias 452, 453, between one or more transistors from among PMOS transistors $T_{21}$, $T_{22}$, $T_{23}$, $T_{24}$, and one or more NMOS transistors from among transistors $T_{11}$, $T_{12}$, $T_{13}$, $T_{14}$ (FIG. 10C).

A variant production method is illustrated in FIGS. 11A-11C. This variant enables, for example, a device of the type illustrated in FIG. 7 to be implemented.

For this example method, steps such as those described above in connection with FIGS. 8A-8B are firstly implemented.

After having formed handle layers 320 and 420, the sacrificial support layer is removed from one of the two substrates, for example sacrificial support layer 300 from the first substrate.

After this, if support layer 300 is removed from the first substrate, apertures 332 are produced in insulating layer 301 of this substrate opposite transistors $T_{11}$, $T_{12}$, $T_{13}$, $T_{14}$, so as to reveal respectively thin semiconductor layer 302.

Apertures 332 can have a dimension called a critical dimension Dc or diameter Dc of the order of that of the channel length of transistors $T_{11}$, $T_{12}$, $T_{13}$, $T_{14}$, (where critical dimension Dc is measured in a direction parallel to vector $\vec{i}$ of orthogonal marker [O; $\vec{i}$; $\vec{j}$; $\vec{k}$] given in FIG. 11A).

A growth of at least one semiconductor material 336 or stack of semiconductor materials 336 can then be accomplished by epitaxy through apertures 332, so as to fill the latter and form a thickness of semiconductor material 336 resting on the thin semiconductor layer and on insulating layer 301 (FIG. 11B).

Support layer 400, and also insulating layer 401, are removed from the other substrate.

The two substrates are then bonded, by placing thin semiconductor layer 402 against the stack or layer of semiconductor material(s) 336 formed by epitaxy.

One of handle layers 320, 420 is then removed, whilst the other handle layer is retained. For example, handle layer 402 formed on the second substrate, may be the one which may be removed.

Connections can then be formed, for example in the form of at least one horizontal metal line 461 and one vertical metal line 462, enabling one or more PMOS transistors $T_{21}$, $T_{22}$, $T_{23}$, $T_{24}$ to be connected, to one or more NMOS transistors from among transistors $T_{11}$, $T_{12}$, $T_{13}$, $T_{14}$ (FIG. 11C).

With one or other of the example methods which have just been described, transistors $T_{11}$, $T_{12}$, $T_{13}$, $T_{14}$ and $T_{21}$, $T_{22}$, $T_{23}$, $T_{24}$ are formed independently, which notably enables transistors to be implemented opposite one another without having any limitation in terms of the thermal budget required for the manufacturing method.

A variant embodiment of a light-emitting microelectronic device according to the invention is given in FIGS. 12A-12C (where the device is represented with a top view in FIG. 12A and according to transverse section views B'B and A'A respectively in FIGS. 12B and 12C).

The device includes a channel semiconductor region 601 in the form of a semiconductor block commonly called an "end" resting on a substrate 600 which can be, for example, a bulk semiconductor substrate, or a semiconductor-on-insulator type substrate, such as an SOI ("Silicon On Insulator") substrate.

A first N-type transistor having an N-doped active region 603 in which a source region 603a and a drain region 603b are formed, and a second P-type transistor having a P-doped active region 613, in which a source region 613a and a drain region 613b are formed, share semiconductor region 601 in which a channel region is produced. Semiconductor region 601 can be made of an intrinsic semiconductor material. Active regions 603 and 613, together with region 601, thus form a PIN junction.

Source 603a and drain 603b regions of the first transistor are respectively opposite a source 613a and drain 613b region of the second transistor.

Source 603a, 613a and drain 603b, 613b regions of the first transistor and of the second transistor are designed in particular such that an axis X'X passing through source and drain regions 603a, 603b of the first transistor is parallel to another axis Y'Y, passing through source 613a and drain 613b regions of the second transistor, where axes X'X and Y'Y are also parallel and coplanar with an axis Z'Z passing through semiconductor block 601.

With such an arrangement of the source and drain regions, the flow of charge carriers observed in region 601c of semiconductor block 601 and flowing between the source 603a and drain 603b regions of the first transistor, has the same direction as, or a direction parallel to, that of the flow of charge carriers observed in region 601c and flowing between the source 613a and drain 613b regions of the second transistor. Implementation of flows of charge carriers having the same direction therefore enables the recombinations to be improved, and thus the photon emission efficiency.

According to one implementation possibility, semiconductor region 601, and in particular a region 601c of this region 601 located between gates 606 and 616 of transistors $T_1$ and $T_2$, can be formed from a direct-gap semiconductor material.

In this case, semiconductor region 601 may have been produced, for example, by etching of a semiconductor block, followed by filling of regions eliminated by this etching, using a direct-gap semiconductor material.

The invention claimed is:

1. A light-emitting microelectronic device including at least a first transistor having source and drain regions formed in at least a first N-doped semiconductor region and a gate, at least a second transistor having source and drain regions formed in at least a second P-doped semiconductor region and a gate, where the gate of the first transistor and the gate of the second transistor are positioned opposite one another, either side of a region including a given region made of at least one intrinsic or undoped semiconductor material, where the source and drain regions of the first transistor and of the second transistor are designed such that a first axis X'X passing through the source and drain regions of the first transistor, a second axis Y'Y, passing through the source and drain regions of the second transistor, and a third axis passing through said given region are coplanar and parallel.

2. A microelectronic device according to claim 1, where the gate of the first transistor and the gate of the second transistor are positioned head-to-tail.

3. A microelectronic device according to claim 2, wherein the source and drain regions of the first transistor are located in a first plane containing said first axis X'X, where the source and drain regions of the second transistor are located in a second plane, where the second plane contains said second axis Y'Y, and is separate from said first plane and parallel to said first plane, and where a source region of the first transistor is positioned opposite a source or drain region of the second transistor.

4. A microelectronic device according to claim 2, wherein the source and drain regions of the first transistor are located in the same plane as the source and drain regions of the second transistor.

5. A microelectronic device according to claim 1, wherein the source region of the first transistor is positioned opposite the source region of the second transistor, where the drain region of the first transistor is positioned opposite the drain region of the second transistor.

6. A microelectronic device according to claim 1, wherein the first transistor and the second transistor are symmetrical relative to a plane passing through said given region.

7. A microelectronic device according to claim 1, wherein the source region of the first transistor is opposite and separated from a source or drain region of the second transistor by at least one insulating region, wherein the drain region of the first transistor is opposite and separated from a source or drain region of the second transistor by at least one other insulating region.

8. A microelectronic device according to claim 1, wherein said given region is between 2 nm and 100 nm thick.

9. A microelectronic device according to claim 1, wherein said given semiconductor region includes a direct-gap material.

10. A microelectronic device according to claim 1, wherein said given region is formed from a hetero-structure including a stack of at least one first semiconductor material, of at least one second semiconductor material having a different gap to that of the first semiconductor material, or from a stack formed from at least one first semiconductor material, from at least one second semiconductor material, and from at least one third semiconductor material, where the second semiconductor material is located between the first semiconductor material and the third semiconductor material, and has a gap which is smaller than that of said first and third semiconductor materials.

* * * * *